US008487517B2

(12) United States Patent
Fang et al.

(10) Patent No.: US 8,487,517 B2
(45) Date of Patent: Jul. 16, 2013

(54) LED LAMP INCORPORATING FAN AND HEAT SINK ASSEMBLY

(75) Inventors: I-Le Fang, Kaohsiung (TW); Wei-Jen Chen, Kaohsiung (TW); Ming-Tsung Li, Kaohsiung (TW)

(73) Assignee: Sunowealth Electric Machines Industry Co., Ltd., Kaohsiung (TW)

(*) Notice: Subject to any disclaimer, the term of this patent is extended or adjusted under 35 U.S.C. 154(b) by 160 days.

(21) Appl. No.: 13/111,531

(22) Filed: May 19, 2011

(65) Prior Publication Data

US 2012/0235552 A1 Sep. 20, 2012

(30) Foreign Application Priority Data

Mar. 15, 2011 (TW) ................................ 00108662 A

(51) Int. Cl.

| | |
|---|---|
| ***F21V 29/00*** | (2006.01) |
| ***F21V 29/02*** | (2006.01) |
| ***H01J 61/52*** | (2006.01) |
| ***H01L 33/64*** | (2010.01) |

(52) U.S. Cl.

USPC ................. 313/35; 313/44; 313/46; 362/294; 362/373; 362/345

(58) Field of Classification Search

USPC .............. 313/11–47; 362/547, 218, 294, 345, 362/373

See application file for complete search history.

(56) References Cited

U.S. PATENT DOCUMENTS

| | | | | |
|---|---|---|---|---|
| 7,461,951 | B2 * | 12/2008 | Chou et al. | 362/294 |
| 2006/0193139 | A1 | 8/2006 | Sun et al. | |
| 2010/0027276 | A1 * | 2/2010 | Kornitz et al. | 362/373 |
| 2010/0172144 | A1 * | 7/2010 | Liu | 362/373 |
| 2010/0246166 | A1 * | 9/2010 | Hsu et al. | 362/184 |
| 2010/0259935 | A1 * | 10/2010 | Scordino et al. | 362/294 |
| 2012/0008330 | A1 * | 1/2012 | Horng et al. | 362/373 |
| 2012/0033419 | A1 * | 2/2012 | Kim et al. | 362/235 |

FOREIGN PATENT DOCUMENTS

| | | | |
|---|---|---|---|
| TW | M346745 | | 7/2008 |
| TW | I316121 | B1 | 10/2009 |
| TW | M372927 | U1 | 1/2010 |
| TW | I334528 | B1 | 12/2010 |

* cited by examiner

*Primary Examiner* — Mariceli Santiago
(74) *Attorney, Agent, or Firm* — Muncy, Geissler, Olds & Lowe, PLLC

(57) ABSTRACT

A lamp includes a housing, a heat sink, a cooling fan and a light-emitting module. The housing has an assembling opening and an electrical connection member on two ends thereof, wherein the housing further comprises an inner wall and a portion of the inner wall adjacent to the assembling opening is an air-guiding wall. The heat sink has a base plate disposed at the assembling opening of the housing, wherein the base plate has at least one partitioning board defining an air channel of the heat sink. A first air-guiding opening is formed between the air-guiding wall and the at least one partitioning board, and a second air-guiding opening is formed between the air channel and the air-guiding wall. The cooling fan is coupled with the heat sink and has an impeller. The light-emitting module is coupled with the base plate of the heat sink.

10 Claims, 7 Drawing Sheets

LED LAMP INCORPORATING FAN AND HEAT SINK ASSEMBLY

BACKGROUND OF THE INVENTION

1. Field of the Invention

The present invention generally relates to a lamp and, more particularly, to a lamp with cooling function.

2. Description of the Related Art

Referring to FIG. 1, Taiwanese Patent No. I316121 discloses a conventional lamp 8 with a housing 81. The conventional lamp 8 consists of a first housing 811 and a second housing 812. The first housing 811 has an air outlet 811*a* and an air inlet 812*a*. The housing 81 has a heat sink 82, a light-emitting element 83 and a cooling fan 84, with the heat sink 82 disposed between the light-emitting element 83 and the cooling fan 84. Based on the structure, the cooling fan 84 may draw the external air into the conventional lamp 8 via the air inlet 812*a*. The drawn air will travel through the heat sink 82 and be expelled from the conventional lamp 8 via the air outlet 811*a*. Thus, heat generated by the light-emitting element 83 can be dissipated.

However, since the housing 81 consists of at least two housings (first and second housings 811 and 812), more components are used and the overall structure of the conventional lamp 8 is more complex. In addition, the conventional lamp 8 requires forming a plurality of holes on the housing 81 as the air outlet 811*a* and the air inlet 812*a*, it will be more difficult to manufacture the conventional lamp 8. This results in an increment in manufacturing costs.

Besides, the conventional lamp 8 should be partially inserted into a decorative ceiling consisting of a plurality of ceiling panels for aesthetic consideration. Therefore, the air outlet 811*a* and the air inlet 812*a* will be settled into a confined space above the decorative ceiling where the ventilation is poor. As a result, the heat of the lamp will accumulate in the confined space, shortening the service life of the conventional lamp 8.

Referring to FIG. 2, Taiwanese Patent No. M346745 discloses another conventional lamp 9 comprising a housing 91, a heat sink 92, a fan 93 and a light-emitting diode (LED) unit 94. The housing 91 consists of an upper housing 911 and a lower housing 912. The upper housing 911 has a plurality of vents 911*a* and the lower housing 912 has a through hole 912*a*. The heat sink 92 is disposed in the housing 91, with an air channel 95 formed between the heat sink 92 and the through hole 912*a* of the lower housing 912. The fan 93 is also disposed in the housing 91 and coupled with the heat sink 92. The LED unit 94 is coupled with the heat sink 92. In such an arrangement, the external air can be drawn into the conventional lamp 9 via the vents 911*a* and the air inside the conventional lamp 9 can be expelled via the through hole 912*a*, thereby dissipating the heat generated by the LED unit 94.

However, the conventional lamp 9 also contains two housings (the upper and lower housings 911 and 912) and therefore has larger component consumption and more complex structure. Furthermore, the conventional lamp 9 still requires forming the vents 911*a* on the upper housing 911 even though the air channel 95 has been provided between the heat sink 92 and the through hole 912*a*. Therefore, the conventional lamp 9 has the same drawbacks of inconvenient processing and high manufacturing costs as the conventional lamp 8. When the conventional lamp 9 is partially inserted into the decorative ceiling, the air inlet 812*a* is still settled into the confined space above the decorative ceiling although the air channel 95 is located outside the confined space beneath the decorative ceiling for better air convection. Thus, the conventional lamp 9 still has poor cooling efficiency, which shortens the service life thereof.

SUMMARY OF THE INVENTION

It is therefore the primary objective of this invention to provide a lamp which does not require forming any air inlet or outlet on a housing thereof. Thus, the lamp will have a simplified structure and is easy to manufacture.

It is another objective of this invention to provide a lamp which ensures the external air to flow into and out of the lamp smoothly when the lamp is partially inserted into a decorative ceiling. Thus, the lamp will have better heat dissipation and normal operation.

The invention discloses a lamp including a housing, a heat sink, a cooling fan and a light-emitting module. The housing has an assembling opening and an electrical connection member on two ends thereof, wherein the housing further comprises an inner wall and a portion of the inner wall adjacent to the assembling opening is an air-guiding wall. The heat sink has a base plate disposed at the assembling opening of the housing, wherein the base plate has at least one partitioning board defining an air channel of the heat sink. A first air-guiding opening is formed between the air-guiding wall and the at least one partitioning board, and a second air-guiding opening is formed between the air channel and the air-guiding wall. The cooling fan is coupled with the heat sink and has an impeller. The light-emitting module is coupled with the base plate of the heat sink.

The least one partitioning board includes two opposing partitioning boards defining the air channel. In this arrangement, smooth air flowing of the lamp is provided.

The lamp further comprises a light-permeable hood coupled with the heat sink, wherein the light-permeable hood has an opening portion and the light-emitting module is received in the light-permeable hood through the opening portion. In this arrangement, the light-permeable hood can provide different illumination effects for the lamp and protect the light-emitting module.

The light-permeable hood has an air-guiding shoulder portion on a periphery thereof, and an air-guiding gap is formed between the air-guiding shoulder portion and one end of the housing adjacent to the assembling opening. In this arrangement, the air flowing of the lamp can be facilitated.

The heat sink further comprises a plurality of fins spaced from each other in the air channel. In this arrangement, the heat dissipation efficiency of the lamp can be improved.

Each of the fins comprises two ends abutting against the air-guiding wall of the housing. In this arrangement, the coupling between the heat sink and the housing can be reinforced.

Alternatively, each of the fins comprises two ends and both the two ends are spaced from the air-guiding wall of the housing by a distance. In this arrangement, the air-guiding ability of the lamp can be improved.

The fins form a positioning board on one side thereof and the cooling fan is positioned on the positioning board. In this arrangement, convenient assembly and disassembly of the lamp can be provided.

Each of the at least one partitioning board has first and second ends abutting against the air-guiding wall of the housing. In this arrangement, noise is reduced and smooth air flowing is provided.

The housing of the lamp further comprises a plurality of fixing poles on the inner wall thereof, the heat sink further comprises a plurality of assembling poles on an outer edge thereof that correspond to the plurality of fixing poles, and the heat sink is positioned at the assembling opening of the housing via fixing members extending into the fixing poles through the assembling poles. In this arrangement, convenient assembly of the lamp is provided.

The impeller of the lamp has a rotation range, the two opposing partitioning boards are spaced from each other by a distance in a radial direction, the impeller is located between the two opposing partitioning boards, and the distance is larger than or equal to the diameter of the rotation range. In this arrangement, the overall cooling efficiency of the lamp is improved.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
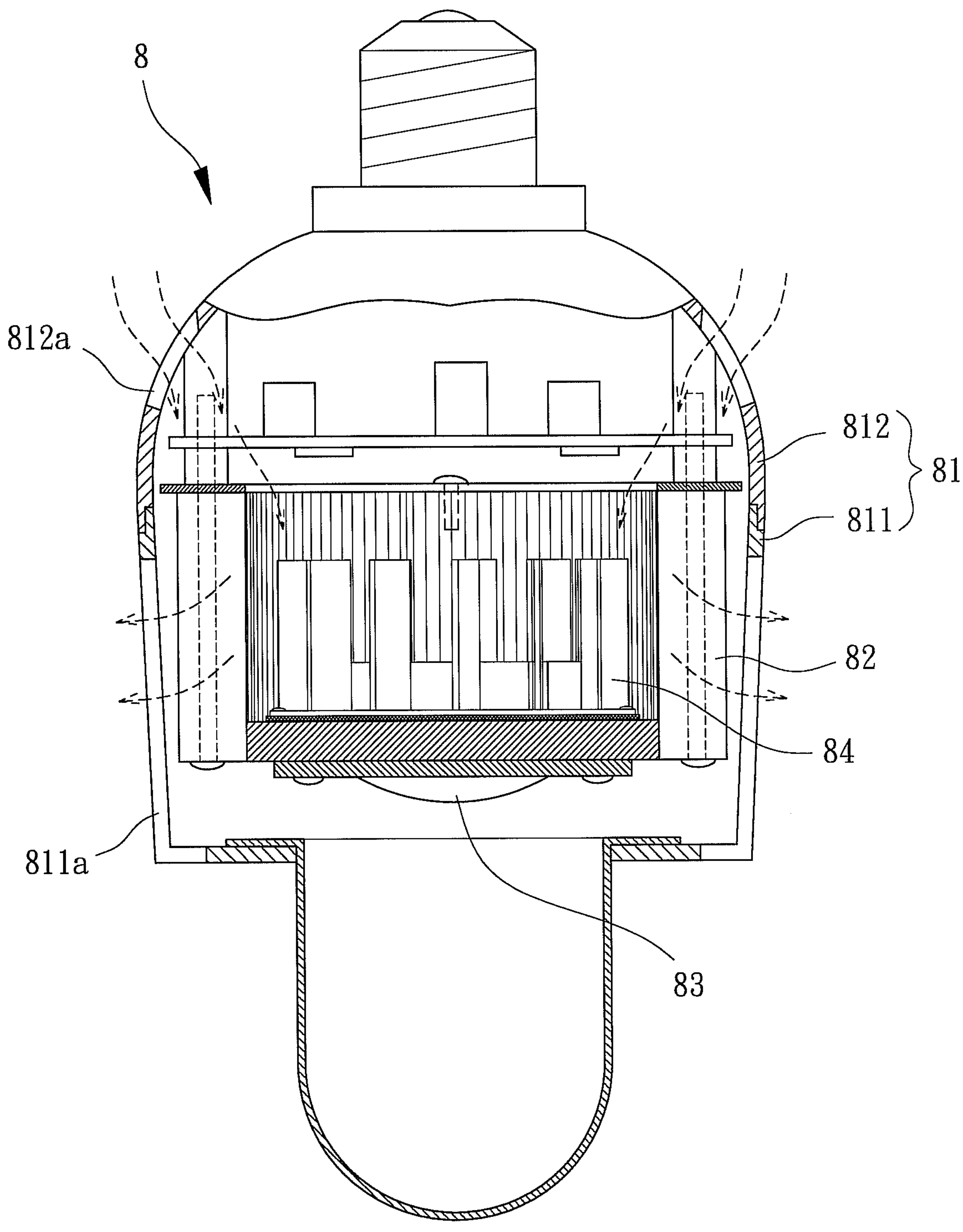
FIG. 1 PRIOR ART
FIG. 1 shows a cross-sectional view of a conventional lamp.
Figure 2:
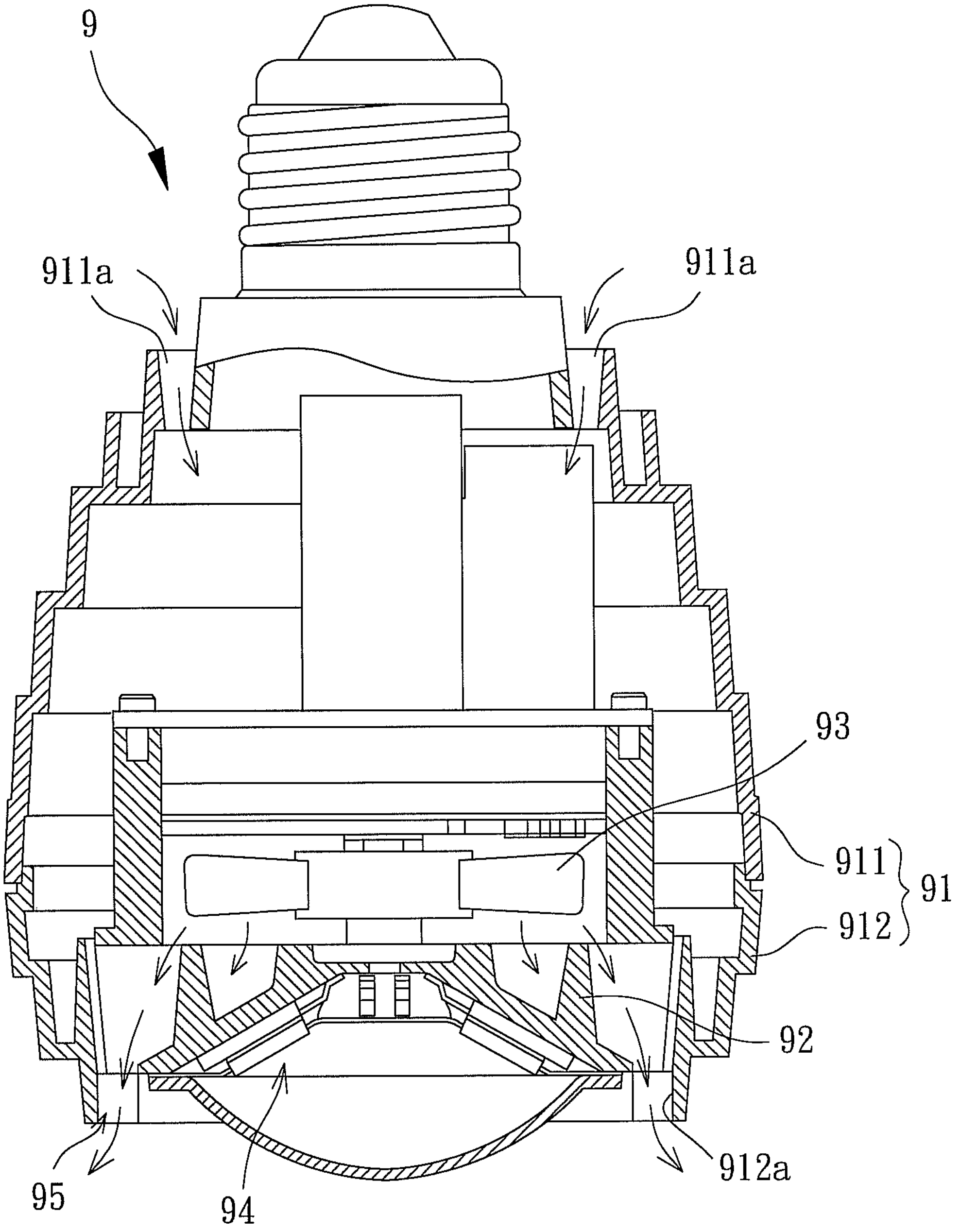
FIG. 2 PRIOR ART
FIG. 2 shows a cross-sectional view of another conventional lamp.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Figure 3:
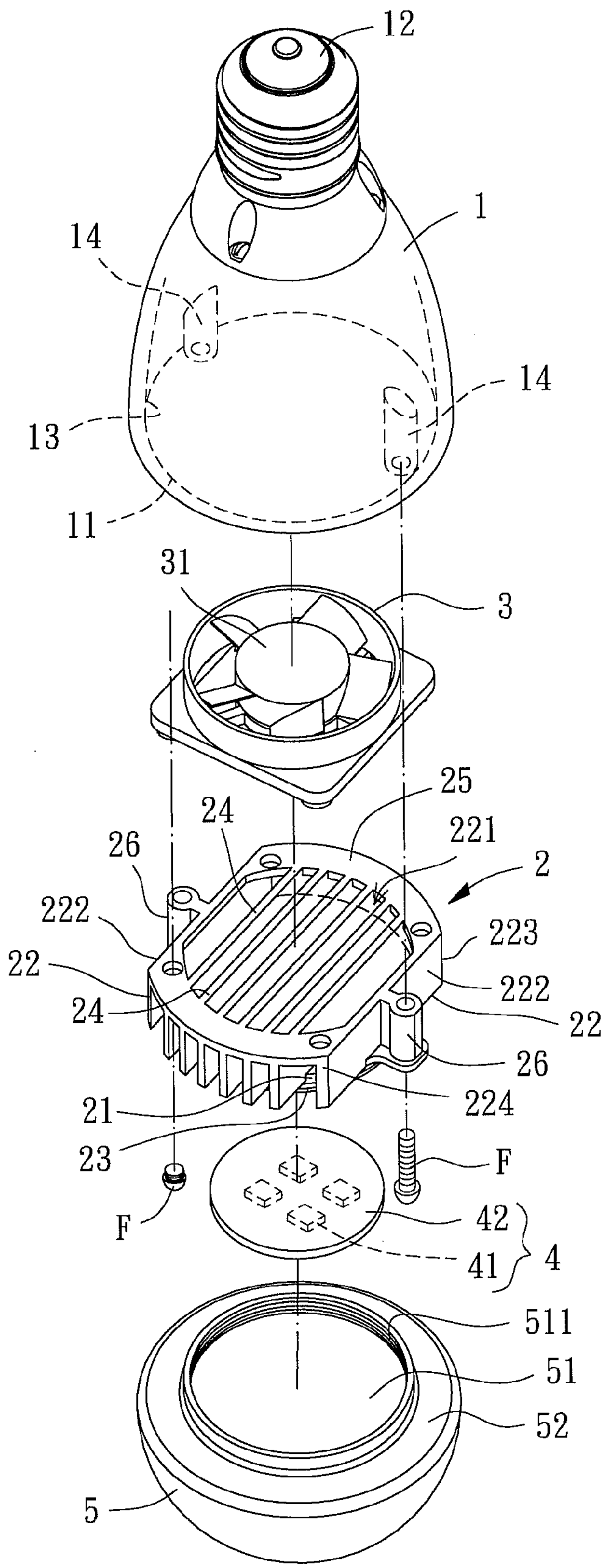
FIG. 3 shows an exploded diagram of a lamp according to a preferred embodiment of the invention.
Figure 4:
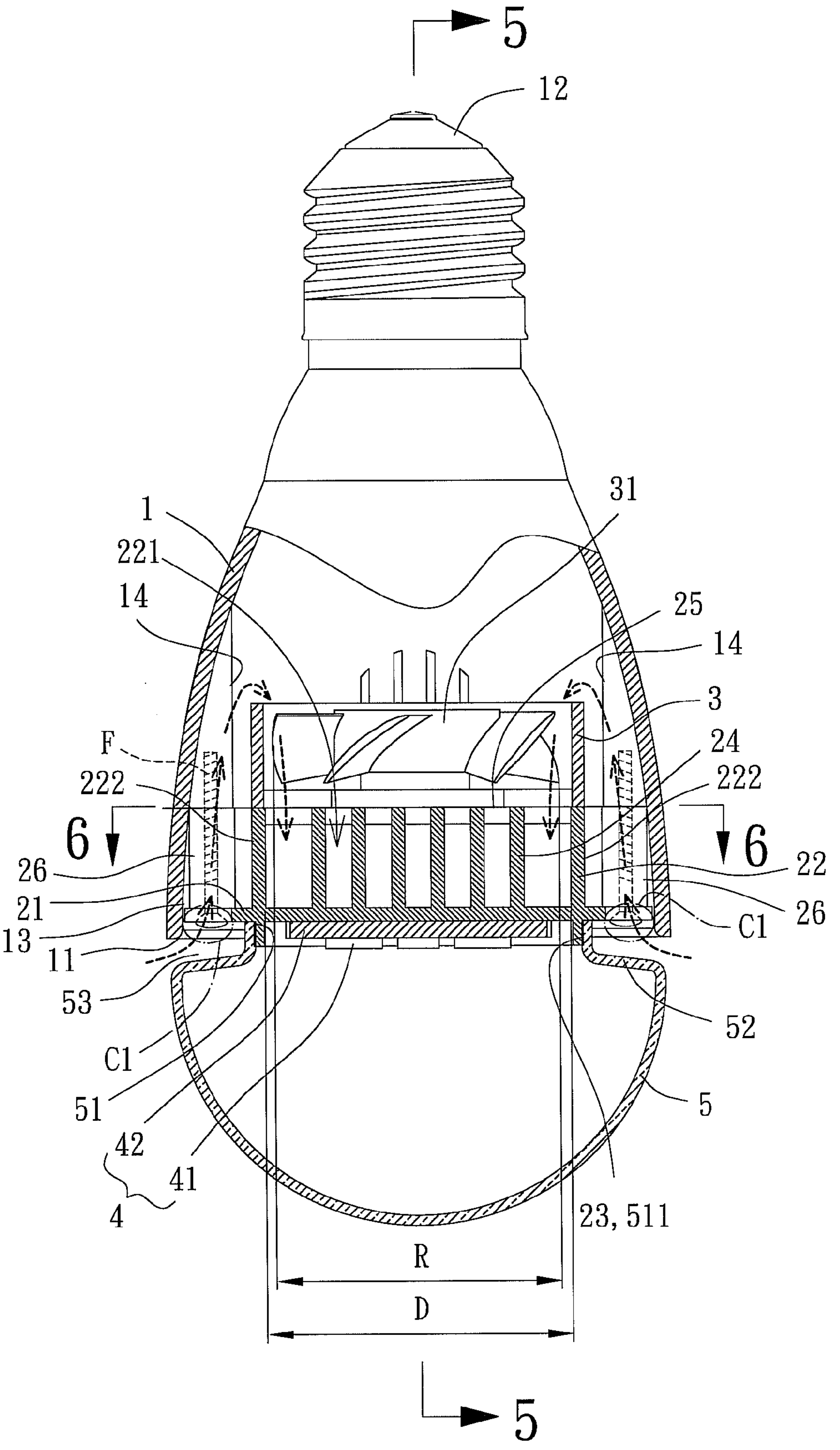
FIG. 4 shows a cross-sectional view of the lamp of the invention.
Figure 5:
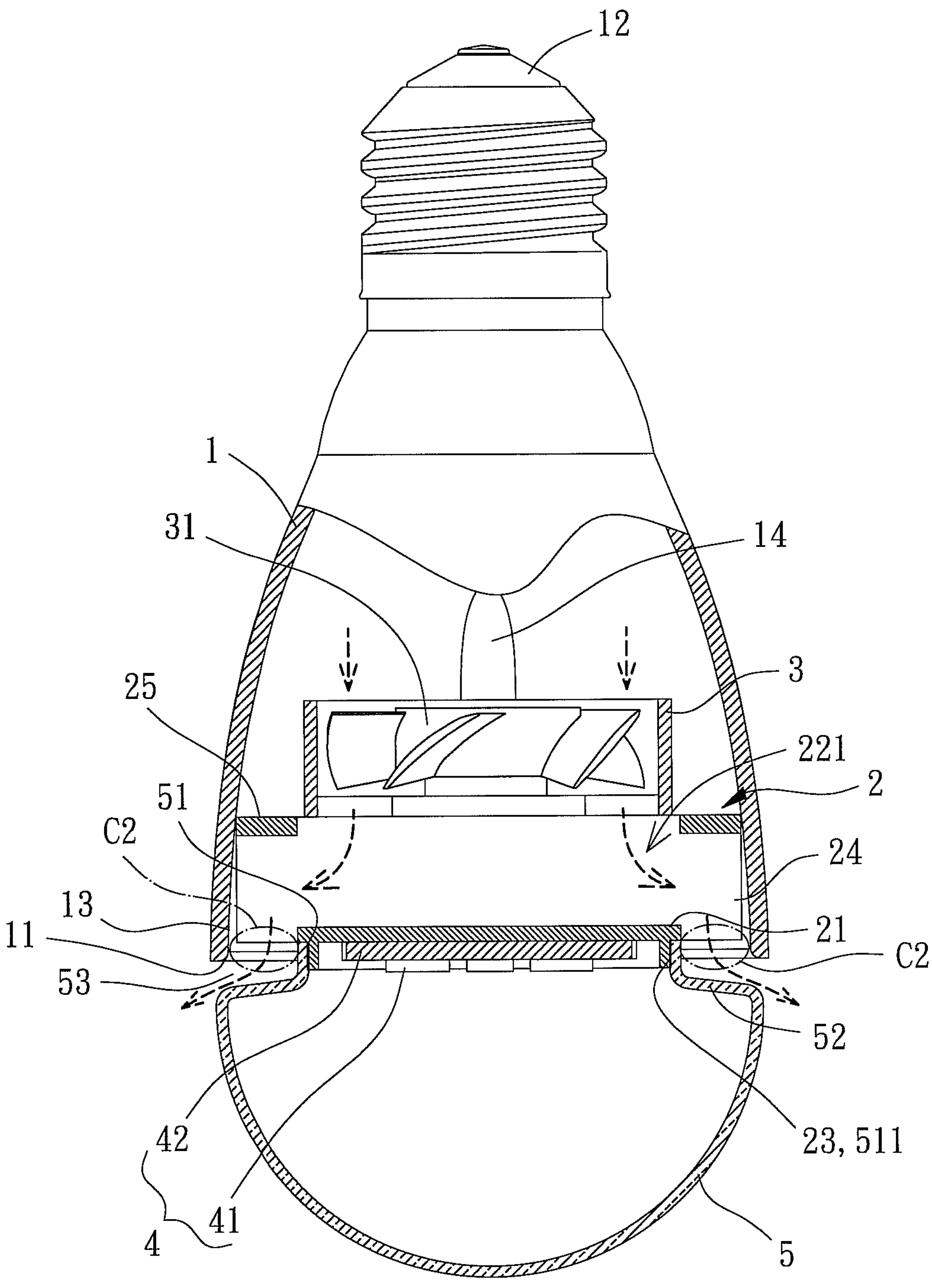
FIG. 5 shows a cross-sectional view of the lamp observed at line 5-5 in FIG. 4.

Referring to FIGS. 3-5, the invention discloses a lamp having at least a housing 1, a heat sink 2, a cooling fan 3 and a light-emitting module 4. The housing 1 is provided to receive the heat sink 2, cooling fan 3 and light-emitting module 4. The cooling fan 3 is coupled with the heat sink 2. The light-emitting module 4 is coupled with the heat sink 2.

The housing 1 is a hollow housing having an assembling opening 11 on one end thereof and an electrical connection member 12 on the other end thereof. The assembling opening 11 communicates with the interior space of the housing 1 so that the heat sink 2 can be disposed in the interior space of the housing 1 via the assembling opening 11. The housing 1 has an inner wall and a portion of the inner wall adjacent to the assembling opening 11 is defined as an air-guiding wall 13 hereinafter. The electrical connection member 12 is in any form capable of providing electrical connection to an external power supply.

Figure 3A:
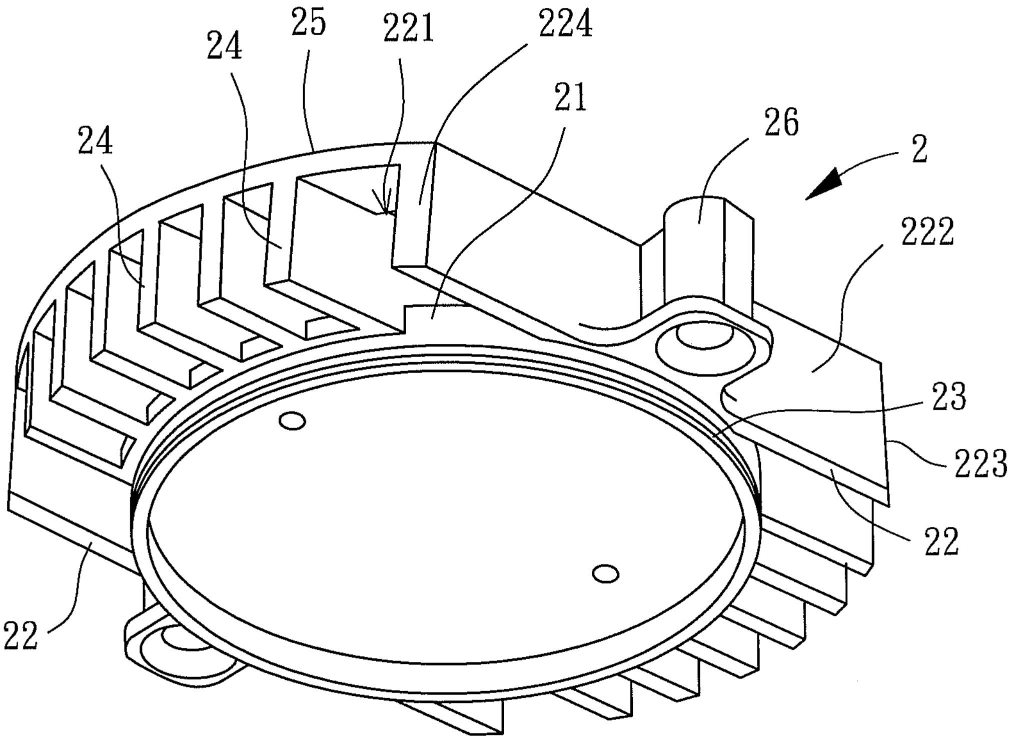
FIG. 3*a* shows a heat sink of the lamp of the invention.
Figure 6:
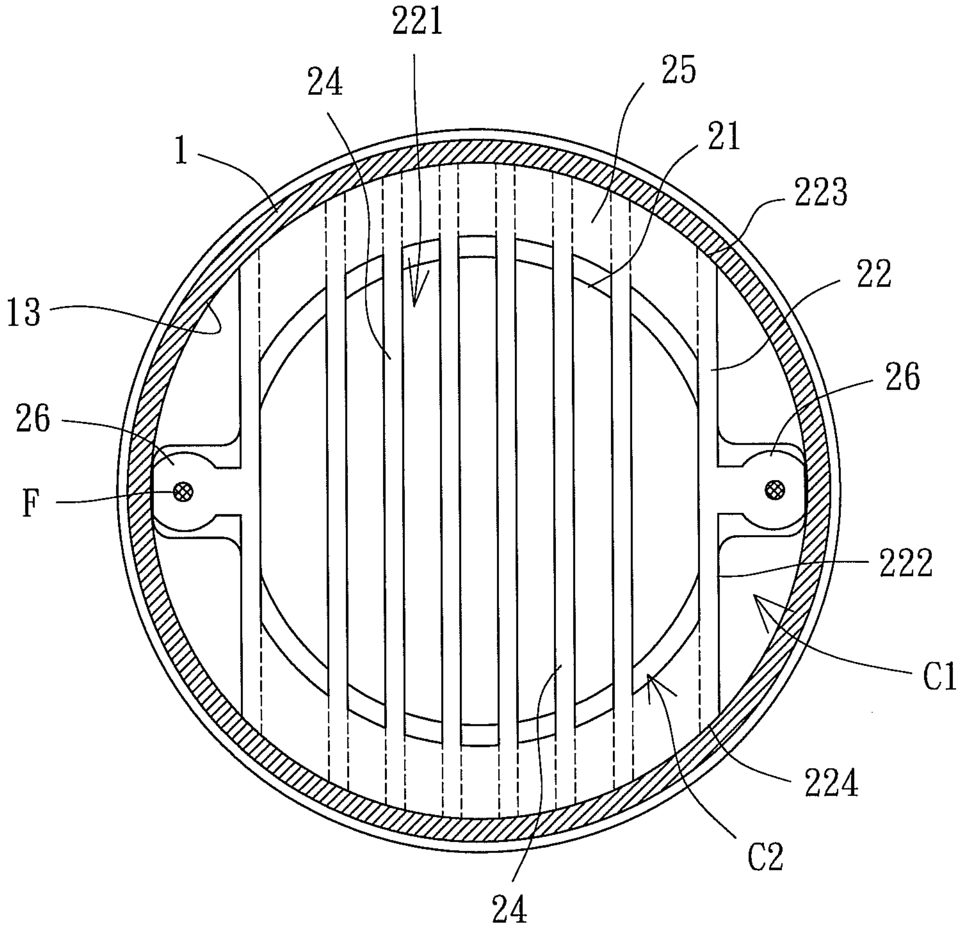
FIG. 6 shows a cross-sectional view of the lamp observed at line 6-6 in FIG. 4.

The heat sink 2 is made of material with heat conductivity. Referring to FIG. 3*a*, the heat sink 2 includes a base plate 21 which is disposed at the assembling opening 11 of the housing 1 when the heat sink 2 is properly received in the housing 1. The base plate 21 has at least one partitioning board 22 and the heat sink 2 forms an air channel 221 based on the at least one partitioning board 22. In the embodiment, the least one partitioning board 22 is shown to include two opposing partitioning boards 22 defining the air channel 221. As shown in FIG. 6, each partitioning board 22 has an outer face 222 facing the air-guiding wall 13 of the housing 1 outwards. A first air-guiding opening C1 is formed between the air-guiding wall 13 and the outer faces 222 of the partitioning boards 22. A second air-guiding opening C2 is formed between the air channel 221 and the air-guiding wall 13 of the housing 1. Both the first air-guiding opening C1 and the second air-guiding opening C2 can act as an air inlet or air outlet different from each other, depending on the rotation direction of the cooling fan 3. For example, the first air-guiding opening C1 can act as an air inlet and the second air-guiding opening C2 can act as an air outlet or, alternatively, the first air-guiding opening C1 can act as an air outlet and the second air-guiding opening C2 can act as an air inlet.

The cooling fan 3 is coupled with the heat sink 2. The cooling fan 3 may be an axial flow fan or centrifugal fan, with the axial flow fan preferred. In addition, the cooling fan 3 has an impeller 31 and may be fixed on the heat sink 2 via fixing members F such as screws. Thus, the cooling fan 3 and the heat sink 2 can provide a predetermined cooling function.

The light-emitting module 4 includes a light-emitting element 41 and a control base plate 42. The light-emitting element 41 may be a light-emitting device (LED) module, bulb or other devices with light-emitting function. The control base plate 42 is electrically connected to the light-emitting element 41 so that the control base plate 42 can control the light-emitting element 41 to emit light. In the embodiment, the light-emitting element 41 is implemented as the LED module for longer service life and power saving. The control base plate 42 is electrically connected to the electrical connection member 12 of the housing 1 and adhered to the base plate 21 of the heat sink 2, enabling the heat sink 2 to efficiently reduce the operation temperature of the light-emitting module 4.

When the lamp of the invention is in use, the lamp can be installed in places where illumination is required, such as wall, ceiling and so on. As an example, the housing 1 of the lamp can be partially inserted into the decorative ceiling in a way that the assembling opening 11 and the light-emitting element 41 of the light-emitting module 4 are located outside the confined space beneath the decorative ceiling. In addition, since the first air-guiding opening C1 and the second air-guiding opening C2 are formed between the heat sink 2 and the portion of the inner wall of the housing 1 adjacent to the assembling opening 11, the first air-guiding opening C1 and the second air-guiding opening C2 are allowed to locate beneath the decorative ceiling to communicate with external air. Moreover, the electrical connection member 12 of the housing 1 can be electrically connected to a general power-supplying system that provides required power to the control base plate 42 of the light-emitting module 4. As such, the control base plate 42 of the light-emitting module 4 can control the light-emitting element 41 to emit light. When the cooling fan 3 rotates, referring to FIG. 4, the external air can be drawn into the housing 1 and the air channel 221 of the heat sink 2 via the first air-guiding opening C1, and the air in the housing 1 and the air channel 221 can be expelled via the second air-guiding opening C2 (as shown in FIG. 5). Thus, the heat generated by the light-emitting module 4 can be dissipated.

Based on the disclosed structure of the lamp, the lamp of the invention is characterized in forming the first air-guiding opening C1 and the second air-guiding opening C2 between the assembling opening 11 and the heat sink 2. Specifically, when the heat sink 2 is disposed at the assembling opening 11 of the housing 1, the first air-guiding opening C1 is formed between the two partitioning boards 22 and the air-guiding wall 13, and the second air-guiding opening C2 is formed between the air channel 221 and the air-guiding wall 13. Therefore, the lamp of the invention may use the assembling opening 11, that has already been constructed for assembling purpose, to form the first air-guiding opening C1 and the second air-guiding opening C2. This omits the need of forming any air inlet or outlet on the housing 1. As an advantage, the overall structural complexity and costs are reduced and the manufacturing convenience is improved. Furthermore, when the lamp of the invention is partially inserted into the decorative ceiling, the first air-guiding opening C1 and the second air-guiding opening C2 can also locate outside the confined space beneath the decorative ceiling where the light-emitting module 4 locates. Based on the design, the cooling fan 3 can smoothly guide the air to flow into and out of the lamp, thereby improving the overall heat dissipation efficiency and prolonging the service life of the lamp.

Based on the structural design of the lamp of the invention, the lamp of the invention may further include one or more of the following secondary features for further improvement, as described below.

Referring to FIG. 3 again, the lamp of the invention preferably includes a light-permeable hood 5 coupled with the heat sink 2. The light-permeable hood 5 has an opening portion 51. The light-emitting module 4 is received in the light-permeable hood 5 through the opening portion 51. As shown in FIG. 3, the opening portion 51 has an outer thread portion 511 on a periphery thereof. The base plate 21 has a threadedly-engaging portion 23 that surrounds the light-emitting module 4 when the heat sink 2 is disposed in the housing 1 in position. The light-permeable hood 5 can be coupled with the heat sink 2 by threadedly engaging the outer thread portion 511 with the threadedly-engaging portion 23. In such an arrangement, the light-emitting module 4 may emit light through the light-permeable hood 5. In addition, the light-permeable hood 5 can be of different color or type to produce different illumination effects. Moreover, the light-permeable hood 5 can also serve the purpose of protecting the light-emitting module 4. In overall, the light-permeable hood 5 can provide different illumination effects while protecting the light-emitting module 4.

Referring to FIGS. 3-5 again, the light-permeable hood 5 has an air-guiding shoulder portion 52 on a periphery thereof, with the air-guiding shoulder portion 52 being adjacent to the opening portion 51. In such an arrangement, an air-guiding gap 53 may be formed between the air-guiding shoulder portion 52 and one end of the housing 1 adjacent to the assembling opening 11. As such, the cooling fan 3 will guide the air to flow into and out of the housing 1 in a horizontal direction through the air-guiding gap 53 (from the first air-guiding opening C1 to the second air-guiding opening C2, or from the second air-guiding opening C2 to the first air-guiding opening C1). Based on this, the air-guiding shoulder portion 52 can facilitate the flowing of the air passing through the air-guiding gap 53. With the air-guiding shoulder portion 52, the air flowing of the lamp can be facilitated.

Referring to FIG. 3 again, the heat sink 2 preferably includes a plurality of fins 24 in the air channel 221. The fins 24 are spaced from each other and located between the two partitioning boards 22. In such an arrangement, the fins 24 may increase the heat exchange areas when the cooling fan 3 guides the air to pass through the air channel 221. Based on the fins 24, the heat dissipation efficiency of the lamp can be improved.

Referring to FIG. 6 again, each fin 24 preferably includes two ends abutting against the air-guiding wall 13 of the housing 1. Based on this, the heat sink 2 can securely abut against the inner wall of the housing 1 when the heat sink 2 is disposed at the assembling opening 11 of the housing 1. Thus, the coupling between the heat sink 2 and the housing 1 can be improved. Alternatively, both two ends of each fin 24 may be spaced from the air-guiding wall 13 of the housing 1 by a distance. In this arrangement, although the heat sink 2 does not abut against the inner wall of the housing 1, the heat sink 2 can be prevented from hindering the air from flowing into and out of the second air-guiding opening C2. Thus, the air-guiding ability of the lamp can be improved.

Referring to FIG. 3 again, the fins 24 may form a positioning board 25 on one side thereof away from the base plate 21, allowing the cooling fan 3 to be screwed on the positioning board 25 of the heat sink 2 via fixing members F such as screws. This allows the cooling fan 3 not only to be positioned properly on the heat sink 2 but also to be removed from the heat sink 2 as desired. Thus, easy repair of the lamp is attained. Based on such structure, convenient assembly and disassembly of the lamp can be provided.

Referring to FIG. 6 again, each partitioning board 22 of the heat sink 2 preferably has first and second ends 223 and 224 facing and abutting against the air-guiding wall 13 of the housing 1. The partitioning boards 22 may efficiently separate the first air-guiding opening C1 from the second air-guiding opening C2, avoiding the occurrence of turbulence when the cooling fan 3 guides the air through the first air-guiding opening C1 and the second air-guiding opening C2. Based on such structures, noise will be reduced and smooth air flowing is provided.

Referring to FIG. 3 again, the housing 1 of the lamp preferably includes a plurality of fixing poles 14 on the inner wall thereof. Accordingly, the heat sink 2 includes a plurality of assembling poles 26 on an outer edge thereof that correspond to the plurality of fixing poles 14. Therefore, the heat sink 2 may be accurately positioned at the assembling opening 11 via fixing members F (such as screws) extending into the fixing poles 14 through the assembling poles 26. At this point, the first air-guiding opening C1 and the second air-guiding opening C2 are formed between the heat sink 2 and the air-guiding wall 13 of the housing 1. Based on the fixing poles 14 and the assembling poles 26, convenient assembly of the lamp is provided.

Referring to FIG. 4 again, the cooling fan 3 of the lamp of the invention includes an impeller 31 having a rotation range R, and the partitioning boards 22 are spaced from each other by a distance D in a radial direction of the lamp. The impeller 31 is located between the two partitioning boards 22, with the distance D being preferably larger than or equal to the diameter of the rotation range R. In such an arrangement, the impeller 31 of the cooling fan 3 may draw the air into the air channel 221 between the two partitioning boards 22 for predetermined cooling operation. Based on such structures, the overall cooling efficiency of the lamp is improved.

In conclusion, the lamp of the invention does not require forming any air inlet or air outlet on the housing 1 as the air can flow into and out of the housing 1 through the first air-guiding opening C1 and the second air-guiding opening C2. Thus, the lamp of the invention will have a simplifier structure, which provides convenient manufacturing of the lamp. Furthermore, when the lamp is partially inserted into the decorative ceiling, the first air-guiding opening C1 and the second air-guiding opening C2 can allow the external air to pass through the lamp for heat dissipation. Thus, the service life of the lamp is prolonged.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A lamp, comprising:

a housing having an assembling opening and an electrical connection member on two ends thereof, wherein the housing further comprises an inner wall and a portion of the inner wall adjacent to the assembling opening is an air-guiding wall;

a heat sink having a base disposed at the assembling opening of the housing, wherein the base plate has at least one partitioning board defining an air channel of the heat sink, each of the at least one partitioning board has first and second ends abutting against the air-guiding wall of the housing, a first air-guiding opening is formed between the air-guiding wall and the at least one partitioning board, and a second air-guiding opening is formed between the air channel and the air-guiding wall;

a cooling fan coupled with the heat sink and having an impeller; and a light-emitting module coupled with the base plate of the heat sink.

2. The lamp as claimed in claim 1, wherein the least one partitioning board includes two opposing partitioning boards defining the air channel.

3. The lamp as claimed in claim 1, further comprising a light-permeable hood coupled with the heat sink, wherein the light-permeable hood has an opening portion and the light-emitting module is received in the light-permeable hood through the opening portion.

4. The lamp as claimed in claim 3, wherein the light-permeable hood has an air-guiding shoulder portion on a periphery thereof, and an air-guiding gap is formed between the air-guiding shoulder portion and one end of the housing adjacent to the assembling opening.

5. The lamp as claimed in claim 1, wherein the heat sink further comprises a plurality of fins spaced from each other in the air channel.

6. The lamp as claimed in claim 5, wherein each of the fins comprises two ends abutting against the air-guiding wall of the housing.

7. The lamp as claimed in claim 5, wherein each of the fins comprises two ends and both the two ends are spaced from the air-guiding wall of the housing by a distance.

8. The lamp as claimed in claim 5, wherein the fins form a positioning board on one side thereof and the cooling fan is positioned on the positioning board.

9. The lamp as claimed in claim 1, wherein the housing further comprises a plurality of fixing poles on the inner wall thereof, the heat sink further comprises a plurality of assembling poles on an outer edge thereof that correspond to the plurality of fixing poles, and the heat sink is positioned at the assembling opening of the housing via fixing members extending into the fixing poles through the assembling poles.

10. The lamp as claimed in claim 2, wherein the impeller has a rotation range, the two opposing partitioning boards are spaced from each other by a distance in a radial direction, the impeller is located between the two opposing partitioning boards, and the distance is larger than or equal to the diameter of the rotation range.

* * * * *